(12) United States Patent
Che et al.

(10) Patent No.: US 7,879,410 B2
(45) Date of Patent: Feb. 1, 2011

(54) METHOD OF FABRICATING AN ELECTROCHEMICAL DEVICE USING ULTRAFAST PULSED LASER DEPOSITION

(75) Inventors: Yong Che, Ann Arbor, MI (US); Zhendong Hu, Ann Arbor, MI (US)

(73) Assignee: Imra America, Inc., Ann Arbor, MI (US)

( * ) Notice: Subject to any disclaimer, the term of this patent is extended or adjusted under 35 U.S.C. 154(b) by 862 days.

(21) Appl. No.: 10/863,362

(22) Filed: Jun. 9, 2004

(65) Prior Publication Data
US 2005/0276931 A1 Dec. 15, 2005

(51) Int. Cl.
*H05H 1/24* (2006.01)
(52) U.S. Cl. .................. 427/509; 427/569; 427/508; 427/58; 427/124
(58) Field of Classification Search .......... 427/569, 427/495; 204/192.1; 118/723 R
See application file for complete search history.

(56) References Cited

U.S. PATENT DOCUMENTS

| | | | |
|---|---|---|---|
| 5,338,625 A | | 8/1994 | Bates et al. |
| 5,432,151 A | * | 7/1995 | Russo et al. ................. 505/474 |
| 5,490,912 A | * | 2/1996 | Warner et al. .......... 204/298.02 |
| 5,656,186 A | | 8/1997 | Mourou et al. |
| 6,312,768 B1 | | 11/2001 | Rode et al. |
| 6,372,103 B1 | * | 4/2002 | Perry et al. ............ 204/298.02 |
| 6,645,656 B1 | * | 11/2003 | Chen et al. ..................... 429/32 |
| 6,689,504 B1 | * | 2/2004 | Matsumoto et al. ........... 429/39 |
| 2002/0001746 A1 | * | 1/2002 | Jenson ........................ 429/162 |
| 2003/0160589 A1 | * | 8/2003 | Krasnov et al. ............. 320/107 |

FOREIGN PATENT DOCUMENTS

WO    WO 99/13127 A1    3/1999

OTHER PUBLICATIONS

Million E. et al, "Femtosecond pulsed-laser deposition of BaTiO3", Applied Physics A, 77, pp. 73-80 (2003).*
Kuwata et al. Thin-film lithium battery with amorphous solid electrolyte fabricated by pulsed laser deposition. Electrochemistry Communications 6 (2004) 417-421. Available online Mar. 11, 2004.*
Zhoa et al. Li-V-Si-O thin film electrolyte for all-solid-state Li-ion battery. Journal of Power Science 122 (2003). pp. 174-180.*

(Continued)

*Primary Examiner*—David Turocy
(74) *Attorney, Agent, or Firm*—Buchanan Ingersoll & Rooney PC

(57) ABSTRACT

A method of fabricating a multi-layered thin film electrochemical device is provided. The method comprises: providing a first target material in a chamber; providing a substrate in the chamber; emitting a first intermittent laser beam directed at the first target material to generate a first plasma, wherein each pulse of the first intermittent laser beam has a pulse duration of about 20 fs to about 500 ps; depositing the first plasma on the substrate to form a first thin film; providing a second target material in the chamber; emitting a second intermittent laser beam directed at the second target material to generate a second plasma, wherein each pulse of the second intermittent laser beam has a pulse duration of about 20 fs to about 500 ps; and depositing the second plasma on or above the first thin film to form a second thin film.

24 Claims, 7 Drawing Sheets

OTHER PUBLICATIONS

Dominguez et al. Epitaxial SnO2 thin films on (1012) sapphire by femtosecond pulsed laser deposition. Journal of Applied Physics, vol. 91, No. 3. Feb. 1, 2002. pp. 1060-1065.*

Nam S.C., et al., "Reduction of Irreversibility in the First Charge of Tin Oxide Thin Film Negative Electrodes", Journal of the Electrochemical Society, 148(3), pp. A220-A223 (2001).

Sarradin J., et al., "Tin/Tin Oxide Film Electrodes for Lithium-ion Batteries", Journal of Power Sources, 97-98, pp. 208-210 (2001).

Moon H.S., et al., "Characteristics of sificon-doped tin oxide thin films as anode material for microbatteries", Journal of Ceramic Processing Research, 3 (1), pp. 34-37 (2002).

Park K.S., et al., "Characteristics of tin nitride thin-film negative electrode for thin-film microbattery", Journal of Power Sources, 103, pp. 67-71 (2001).

Perkins J.D., et al., "Pulsed laser deposition and characterization of crystalline lithium cobalt dioxide ($LiCoO_2$) thin films", Journal of the Electrochemical Society, 148 (12), pp. A1302-A1312 (2001).

Hubler, G., "Comparison of Vacuum Deposition Techniques," Pulsed Laser Deposition of Thin Films, Chapter 13, pp. 327-355, John Wiley&Sons, Inc. (1994).

von der Linde, D., et al., "Laser-solid interaction in the femtosecond time regime", Applied Surface Science, 109/110, pp. 1-10 (1997).

Gamaly, E.G., et al, "Electrostatic mechanism of ablation by femtosecond lasers", Applied Surface Science, 197-198, pp. 699-704 (2002).

Millon, E., et al., "Femtosecond pulsed-laser deposition of $BaTiO_3$", Applied Physics A, 77, pp. 73-80 (2003).

Zhao, S., et al., "A solid-state electrolyte lithium phosphorus oxynitride film prepared by pulsed laser deposition", Thin Solid Films 415, pp. 108-113 (2002).

Nuli, Yan-Na et al., "Nanocrystalline tin oxides and nickel oxide film anodes for Li-ion batteries", Journal of Power Sources, 114, pp. 113-120 (2003).

J.E. Dominguez et al., "Epitaxial $SnO_2$ thin films grown on (1012) sapphire by femtosecond pulsed laser deposition", Journal of Applied Physics, vol. 91, No. 3, pp. 1060-1065 (2002).

C. Boulmer-Leborgne et al., "Femtosecond laser beam in interaction with materials for thin film deposition", High-Power Laser Ablation VI, edited by Claude R. Phipps, Proc. of SPIE, vol. 6261, 626120, 2006 (9 pages).

Chen et al., 'Pulsed laser deposition of conducting porous La-Sr-Co-O films', Thin Solid Films 342 (1999), pp. 61-66.

Chen et al., 'Structure and conducting properties of $La_{0.5}Sr_{0.5}CoO_{3-\delta}$ films on YSZ', Thin Solid Films 350 (1999), pp. 130-137.

Krebs, 'Pulsed Laser Deposition of Metals', Chptr. 16 of *Pulsed Laser Deposition of Thin Films*, Robert Eason Ed., John Wiley & Sons (2007), pp. 363-364.

English translation of an Official Action dated Mar. 1, 2010, in corresponding Chinese Patent Application No. 200580018628.3.

Response to the Office Action dated May 4, 2010, in corresponding Chinese Patent Application No. 200580018628.3.

"New trends in femtosecond Pulsed Laser Deposition and femtosecond produced plasma diagnostics", High-Power Laser Ablation VI, edited by Claude R. Phipps, Proc. of SPIE, vol. 6261, 62610L (2006) (Garrelie et al).

* cited by examiner ations, and can be difficult to control the stoichiometry and film quality of thin films formed by sputtering. In addition, sputtering can result in the formation of pinholes during film growth which can adversely affect the performance of the power source.

METHOD OF FABRICATING AN ELECTROCHEMICAL DEVICE USING ULTRAFAST PULSED LASER DEPOSITION

BACKGROUND

In microelectronic systems and microelectromechanical systems (MEMS), it can be beneficial to reduce the physical dimensions of components used therein. An example of such a component is an electrochemical device. For example, it can be beneficial to provide an electrochemical device, such as a power source, having a reduced size that also possesses acceptable performance characteristics.

MEMS can be capable of performing various complex tasks such as, for example, sensing and/or responding to stimulus. MEMS can include various components on a chip which can, for example, form a relatively complex system. Examples of such components can include pumps, valves, relays, micromotors, actuators, sensors and power sources. Solar cells can also be used in MEMS for long-term and/or low-maintenance applications.

Typically, conventional methods and technologies for manufacturing power sources cannot simply be scaled down in order to fabricate power sources for use in microelectronic systems and MEMS, without adversely affecting the performance of such reduced-size power sources.

Sputtering can be used to fabricate thin films for use in a power source. However, it can be difficult to control the stoichiometry and film quality of thin films formed by sputtering. In addition, sputtering can result in the formation of pinholes during film growth which can adversely affect the performance of the power source.

Pulsed laser deposition (PLD) can be used to form thin films. Conventional PLD typically results in the formation of a plasma which contains molten droplets and/or particulates. Such molten droplets and/or particulates can collect on the surface of the substrate during growth, and can result in the degradation of the quality of the film.

SUMMARY

According to one aspect, a method of fabricating a multi-layered thin film electrochemical device is provided. The method comprises:

providing a first target material in a chamber;

providing a substrate in the chamber;

emitting a first intermittent laser beam directed at the first target material to generate a first plasma, wherein each pulse of the first intermittent laser beam has a pulse duration of about 20 fs to about 500 ps;

depositing the first plasma on the substrate to form a first thin film;

providing a second target material in the chamber;

emitting a second intermittent laser beam directed at the second target material to generate a second plasma, wherein each pulse of the second intermittent laser beam has a pulse duration of about 20 fs to about 500 ps; and depositing the second plasma on or above the first thin film to form a second thin film.

DETAILED DESCRIPTION

Methods are provided for fabricating an electrochemical device, for example, a thin film electrochemical device. A thin film electrochemical device can contain at least one thin film, and preferably each layer of such device can be a thin film. For example, each thin film can have a thickness of less than about 10 µm. An exemplary method can enable the fabrication of an electrochemical device having relatively small physical dimensions.

The thin film electrochemical device can be an electrochemical energy conversion device such as, for example, a thin film battery (also known as a supercapacitor), a thin film electrochemical solar cell or a thin film microfuel cell. One example of a thin film battery is a rechargeable lithium ion thin film battery. Alternatively, the thin film electrochemical device can be, for example, a thin film electrochiromic device. The thin film electrochemical device can be used in, for example, microelectronics, microsensors and/or MEMS.

The method can employ pulsed laser deposition using a particular type of laser beam in order to form at least one thin film. For example, an intermittent laser beam can be emitted at a particular pulse duration, and can be directed at a target material to generate a plasma. The plasma can be deposited onto a substrate to form a thin film. At least one additional thin film can be formed on or above the initially formed thin film by providing at least one additional target material and emitting an intermittent laser beam directed at the additional target material.

In an exemplary embodiment, the method can further comprise: providing a third target material in the chanber; emitting a third intermitting laser beam directed at the third target material to generate a third plasma, wherein pulse of the third intermittent laser beam has a pulse duration of duration of 20 fs to about 500 ps; and depositing the third plasma on or above the second thin film to form a third thin film.

Figure 8A:
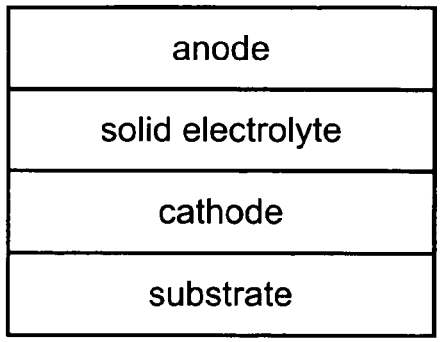
FIGS. 8A to 8C show exemplary arrangements of the cathode, anode, solid electrolyte and current collector thin films, according to exemplary aspects.
Figure 8B:
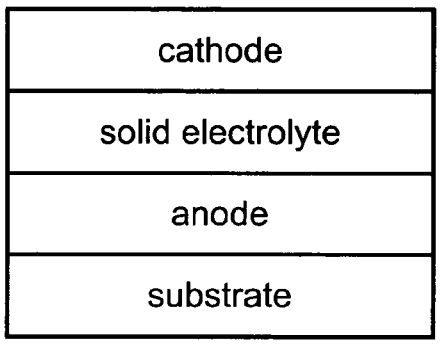

An electrochemical device can be formed in which at least two of the layers thereof are formed using the intermittent laser beam described herein. In an exemplary embodiment, an electrochemical device can be fabricated by forming a cathode thin film on or above a substrate, and forming a solid electrolyte thin film on or above the cathode thin film. An anode thin film can then be formed on or above the solid electrolyte thin film. Referring to FIG. 8A, an exemplary electrochemical device is shown having an anode/solid electrolyte/cathode/substrate structure. In an alternative embodiment, an anode thin film can be formed on a substrate, a solid electrolyte thin film can be formed on the anode thin film, and a cathode thin film can be formed on the solid electrolyte thin film, resulting in a cathode/solid electrolyte/anode/substrate structure, as shown in FIG. 8B.

Figure 8C:
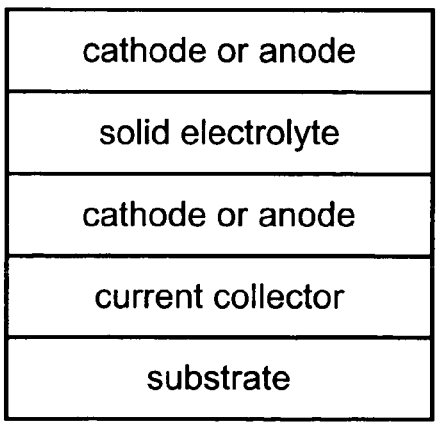

Optionally, a current collector thin film can be deposited between the substrate and the cathode thin film or anode thin film, whichever film is deposited first. Referring to FIG. 8C, an exemplary electrochemical device is shown having such structure. Alternatively, the substrate itself can function as the current collector. In one embodiment, a buffer layer (not shown) can be initially deposited on the substrate to improve adhesion between the substrate and a thin film subsequently deposited thereon. The buffer layer can be formed from, for example, nickel or other suitable material.

A plurality of the thin films present in the electrochemical device can be formed from the pulsed laser deposition described herein. For example, the cathode thin film, solid electrolyte thin film, anode thin film, current collector and/or buffer layer can be formed by use of pulsed laser deposition. Preferably, for example, at least one of the anode and cathode thin films, more preferably at least the anode and cathode thin films, and most preferably at least the anode, cathode, and solid electrolyte thin films, can be formed by use of pulsed laser deposition.

In an alternative embodiment, the solid electrolyte can take the form of a layer or thin film, and can be formed by a process other than pulsed laser deposition. For example, in an embodiment where the solid electrolyte is formed from a relatively flexible material such as a conductive polymer, the solid electrolyte can be formed by any suitable means such as, for example, chemical vapor deposition, electro polymerization and/or thermo polymerization.

The thickness of each thin film present in an electrochemical device can depend on, for example, the particular application of the thin film and/or the material(s) used to form such thin film. For example, the thickness of each of the anode thin film, cathode thin film, solid electrolyte thin film and/or current collector thin film can be less than about 10 μm. Preferably, the solid electrolyte thin film can be sufficiently thick to reduce or avoid the occurrence of electric short circuits.

The intermittent laser beam can comprise a plurality of discrete laser beam emissions, hereinafter referred to as "pulses". The duration of each pulse is hereinafter referred to as the "pulse duration". The pulse durations of the pulses of the intermittent laser beam can be substantially consistent or can vary within a predetermined range, and are preferably substantially consistent. In addition, the periods of time between consecutive pulses can be substantially consistent or can vary within a predetermined range, and are preferably substantially consistent.

In an exemplary embodiment, the pulse duration of each pulse of the intermittent laser beam can be less than or equal to about 500 picoseconds (Ps), preferably about 20 femtoseconds (fs) to about 500 ps, preferably about 20 fs to about 300 ps, more preferably about 50 fs to about 1000 fs, and most preferably about 50 fs to about 500 fs. Use of an intermittent laser beam at the above pulse durations (and particularly the preferred ranges) can result in the formation of a thin film and/or an electrochemical device possessing good crystalline structure, stoichiometry and/or surface morphology characteristics, which can in turn improve the energy density, power density and cycling stability characteristics thereof.

Without wishing to be bound to any particular theory, it is believed that the use of such intermittent laser beam at the above pulse duration ranges can reduce or substantially eliminate the generation of undesirable molten droplets and/or particulates during plasma generation. For example, such undesirable molten droplets and/or particulates can have a size of about 1 μm or greater. The use of the intermittent laser beam can enable the generation of plasma that is substantially free of such molten droplets and/or particulates. The reduction or substantial elimination of the formation of the molten droplets and/or particulates can occur during the formation of any thin film of the electrochemical device, preferably at least during the formation of the cathode, anode and/or solid electrolyte thin films. By comparison, use of a conventional laser beam having a substantially longer pulse duration (such as on the order of one nanosecond or more) typically results in the formation of the molten droplets and/or particulates, which in turn can adversely affect energy conversion performance characteristics of deposited thin films.

Without wishing to be bound to any particular theory, it is also believed that the use of such intermittent laser beam at the above pulse duration ranges can provide a thin film having desirable stoichiometric and/or structural characteristics. The stoichiometry of a thin film can affect its energy conversion performance characteristics. For example, in the case of a tin oxide anode thin film, a higher tin atomic ratio can generally improve the charge-discharge capacity characteristic, whereas a higher oxygen atomic ratio can generally improve the cycling stability characteristic. Thus, it can be beneficial to balance the oxygen-to-tin atomic ratio of a tin oxide thin film. The use of the intermittent laser beam can result in a beneficial oxygen:tin atomic ratio, for example, about 0.5:1 to about 2:1, preferably about 1:1 to about 2:1, more preferably about 1.5:1 to about 2:1.

Without wishing to be bound to any particular theory, it is further believed that the degree of crystallinity of the structure of the thin film can affect the charge/discharge cycling characteristic of a thin film. In one embodiment, the structure of the thin film is not entirely amorphous and is also not entirely crystalline, but is composed of a "nanocrystalline" structure containing grains of various sizes. For example, the thin film can comprise crystalline grains having grain sizes in the range of about 5 to about 500 nm, preferably about 10 to about 100 nm, more preferably about 10 to about 50 nm.

The intermittent laser beam can be provided by any suitable laser source. The laser source, for example, can emit an intermittent laser beam having a predetermined wavelength, frequency and power. For example, the wavelength, frequency and power of the intermittent laser beam can be adjustable by the laser source, or the laser source can be preset to emit an intermittent laser beam having a wavelength, frequency and power at predetermined values. An exemplary laser source that can be used is available from Clark-MXR, Inc. located in Dexter, Mich. under the tradename CPA-2001.

The wavelength, frequency and power of the intermittent laser beam can depend on, for example, the specific target material and substrate being used, the atmosphere in the chamber, and the particular application of the thin film being formed. Preferably, the intermittent laser beam can have any suitable wavelength, for example, a wavelength of about 190 to about 1600 nm. The intermittent laser beam can have any suitable repetition rate, for example, a repetition rate of about 10 Hz to about 100 MHz, preferably about 10 Hz to about 50 kHz. The power of each pulse of the intermittent laser beam can be any suitable amount such as, for example, about $10^{-3}$ to about 100 mJ, preferably about 0.5 to about 5 mJ, more preferably about 1 to about 2 mJ.

The target material can include any material which is capable of generating a plasma when exposed to the intermittent laser beam, wherein the plasma is suitable for forming a thin film on a substrate. In one embodiment, a plurality of target materials can be used, wherein a different target material is used to form different layers of the electrochemical device. For example, a different target material can be used to form each of the anode thin film, cathode thin film, solid electrolyte thin film and/or current collector thin film.

In one embodiment, any target material suitable for forming a cathode, anode, solid electrolyte and/or current collector can be used, and exemplary materials are discussed below. For example, for forming an anode thin film, the target material can include tin, silicon, zinc, aluminum, tungsten, iron, vanadium and/or oxides of such materials. Additionally or alternatively, a carbon-containing material can be used as the target material. Preferably, the target material is selected such that the formed anode thin film can reversibly undergo intercalation/de-intercalation and/or alloying/de-alloying with lithium ions.

For forming a cathode thin film, the target material can include, for example, lithium cobalt oxide, lithium manganese oxide, lithium nickel oxide, lithium iron phosphate and/or vanadium oxide. For forming a solid electrolyte thin film, the target material can include lithium phosphorus oxynitride (LiPON) and/or a lithium-ion conducting glass or ceramic. For forming a current collector thin film, the target material can include a material substantially incapable of forming an alloy with lithium such as, for example, stainless steel, copper and/or nickel.

The formation of the thin film can take place in a conventional deposition chamber such as a vacuum chamber. The characteristics of the thin film can depend on various parameters of the deposition process, for example, the chamber pressure and the chamber atmosphere. For example, the pressure in the chamber during deposition can be about $10^{-8}$ to about $10^{-1}$ torr, preferably about $10^{-4}$ to about $10^{-2}$ torr more preferably about $10^{-3}$ to about $10^{-2}$ torr. The chamber atmosphere can include any gas suitable for use with the PLD described herein, and can contain, for example, oxygen, nitrogen and/or argon. Preferably, the chamber atmosphere can contain one type of gas and is substantially free of other types of gases.

The deposition temperature can also affect the characteristics of the thin film. For example, adjusting the deposition temperature can affect the degree of crystallinity of the thin film and/or the stoichiometry of the thin film. In this manner, such characteristic(s) of the thin film can be controlled by selecting the deposition temperature. As used herein, the term "deposition temperature" refers to the temperature of the surface of the material on which the thin film is formed. For example, when the thin film is formed on a substrate, the deposition temperature is the temperature of the surface of the substrate. When the thin film is formed on a previously formed thin film, the deposition temperature is the temperature of the surface of the previously formed thin film. The deposition temperature can depend on the particular application of the thin film, the chamber pressure, the chamber atmosphere and/or the target material. For example, the deposition temperature can be about 20° C. to about 900° C., more preferably about 300° C. to about 500° C.

Conventional thin film growth typically requires the use of a relatively high deposition temperature. In one embodiment, the use of the intermittent laser beam can enable the formation of a thin film while employing a relatively low deposition temperature. This can in turn enable the use of a low melting point substrate and/or solid electrolyte layer or thin film comprising a material such as, for example, a polymeric material such as a conductive polymer or other relatively flexible materials. For example, the deposition temperature can be below about 300° C., more preferably about 25° C. to about 140° C.

Figure 1:
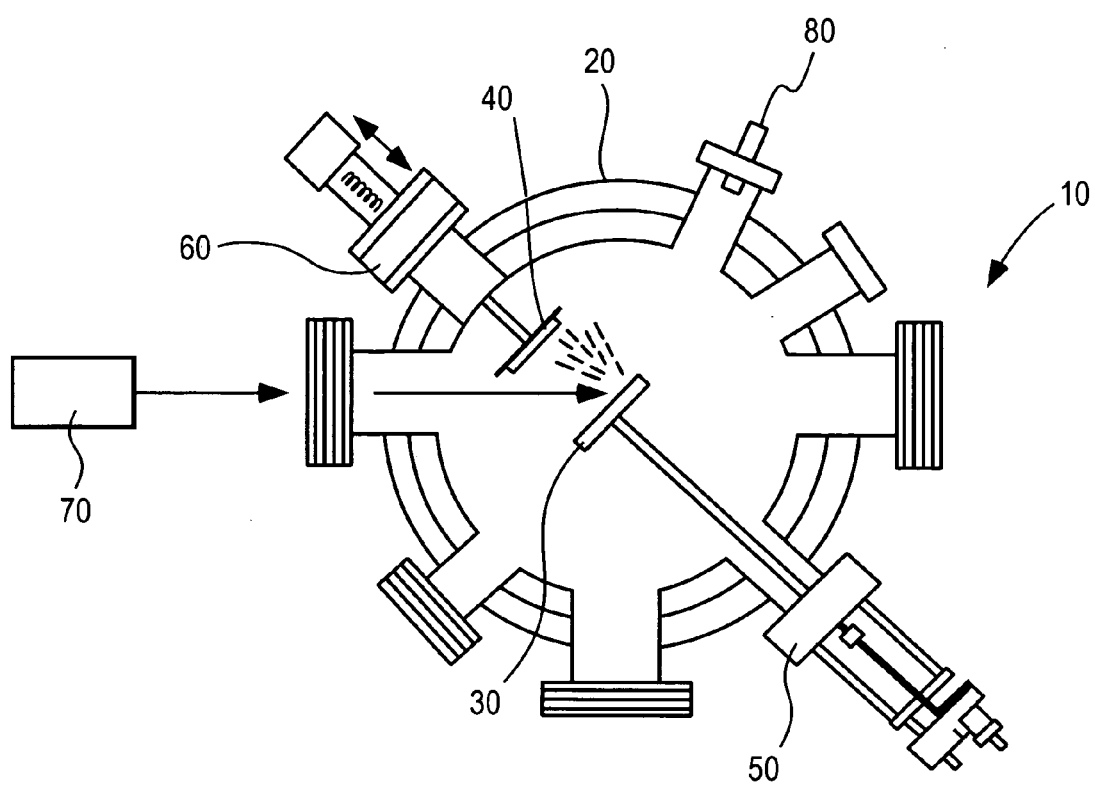
FIG. 1 is a schematic illustration of an ultrafast pulsed laser deposition system for the fabrication of a multi-layered thin film electrochemical device, according to an exemplary aspect.

FIG. 1 shows an exemplary apparatus 10 for fabricating a thin film and/or an electrochemical device containing a plurality of thin films. The apparatus 10 can include a chamber 20 such as a vacuum chamber, in which a target material 30 and a substrate 40 are located. A laser source 70 can be arranged to direct an intermittent laser beam at the target material 30 at any suitable angle, preferably at an angle of about 30° to about 50°, more preferably at about 45°, with respect to the surface of the target material.

The target material 30 and substrate 40 can be held in place by holding devices 50 and 60, respectively. The holding device 50 can include, for example, a multi-target holding device that allows multiple target materials to be alternately positioned in contact with the laser beam. The holding device 50 can, for example, move the target material 30 with respect to the laser beam via rotational and/or translational movement, for example, to obtain a uniform erosion pattern on the surface of the target material 30. The holding device 60 can be used to rotatably and/or translationally move the substrate 40 to improve the uniformity of the film growth on the substrate 40. Additionally or alternatively, the laser source 70 can be rotatably and/or translationally moved to improve the uniformity of the erosion pattern on the target material 30 and/or the film growth on the substrate 40.

At least one gas inlet and/or gas outlet 80 can be arranged at a sidewall of the chamber 20 for introducing a gas into the chamber 20, adjusting the pressure in the chamber 20, and/or creating a vacuum in the chamber 20. A pump (not shown) can be used to conduct turbo-molecular pumping of the chamber 20. The apparatus 10 can also include a sample transfer load-lock (not shown) which includes a second chamber attached to the chamber 20 via a gate valve (not shown). The sample transfer load-lock can enable replacement of materials in the chamber 20 while maintaining a predetermined pressure level in the chamber 20.

The reduced size of the thin film electrochemical energy conversion device can enable same to be arranged on a microchip, for example, in contact with or adjacent to the component to which it provides power. Such arrangement can reduce noise caused by, for example, stray capacitance in power connections, cross talk between power lines and signal lines, and/or ohmic losses. The thin film electrochemical energy conversion device can provide power in an amount of, for example, about 10 to about 100 V and about 1 nA to about 1 μA, depending on the specific application.

The reduced size of the thin film electrochemical energy conversion device can enable the use of multiple electrochemical energy conversion devices in a single system, such as a microelectronic system or MEMS. For example, the electrochemical energy conversion device can be used to provide power to a single component of the system. Preferably, a different electrochemical energy conversion device can be used to power each component of the system. The use of multiple electrochemical energy conversion devices in this manner can reduce control system complexity and/or noise levels, and can increase power efficiency and/or speed of operation.

EXAMPLES

In the examples set forth below, the crystalline structure of the thin films was measured by X-ray diffraction (XRD) using a MiniFlex X-ray Diffractometer, available from Rigaku/MSC located in The Woodlands, Tex., with a chromium cathode. The surface morphology of the films was observed by scanning electron microscopy (SEM). The film thickness of the thin films was measured using Rutherford Backscattering Spectrometry (RBS). The weight of thin films was determined by Inductive Coupled Plasma (ICP). The stoichiometry, i.e., the [O]:[Sn] atomic ratio, of the thin films was measured by Energy Dispersive X-ray Spectrometry (EDS) and RBS. Conventional instruments and methods for implementing ICP, RBS and EDS were used.

Example 1

Formation of Thin Film

Stainless steel disks having 0.5 inch diameter were washed with acetone to remove grease from the surface thereof. A silicon wafer substrate having a 2 inch diameter was etched with 50% hydrofluoric acid for 30 seconds to remove residual silicon oxide, and subsequently was rinsed with de-ionized water. The stainless steel disks were glued to the silicon wafer using silver epoxy glue.

Tin oxide thin films were deposited at various deposition temperatures ranging from ambient temperature (about 25° C.) to about 700° C. The chamber atmosphere had an oxygen gas pressure of 1 mTorr. The distance between the target material and the substrate was 5 cm, and the deposition time was 40 minutes. The laser source was a Clark-MXR CPA-2001 having a 120 fs pulse duration, 1 kHz repetition rate and 0.8mJ pulse energy. The target material was a $SnO_2$ material available from SCl Engineered Materials located in Columbus, Ohio.

Example 2

Effect of Deposition Temperature on Structure of Thin Film

Figure 2:
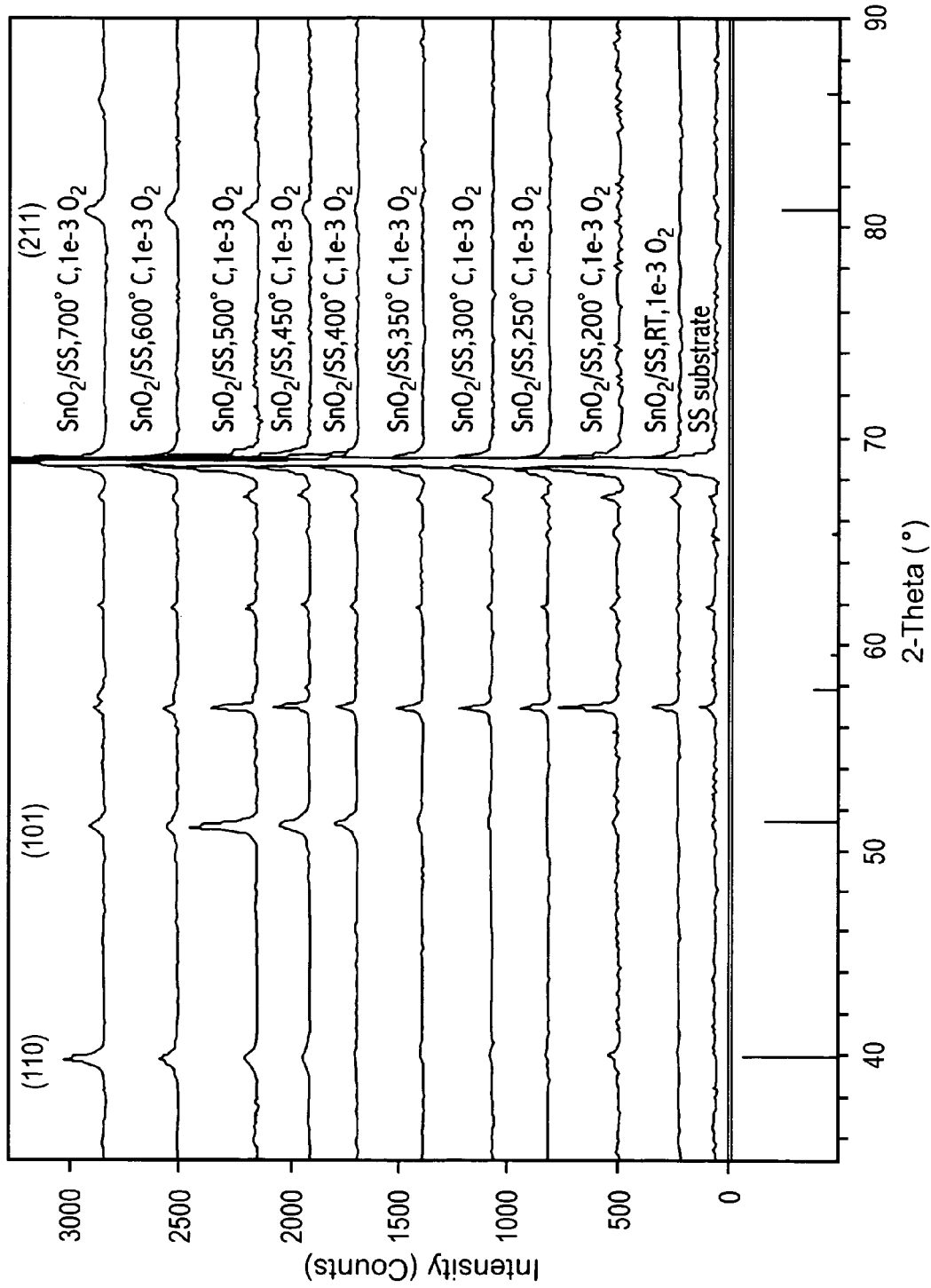
FIG. 2 is a graph showing X-ray diffraction patterns for tin oxide thin films deposited on stainless steel substrates at various temperatures, and an X-ray diffraction pattern for a stainless steel substrate, together with a JCPDS reference of tin oxide, according to an exemplary aspect.

FIG. 2 shows XRD spectra of the tin oxide thin films deposited at different temperatures, as well as of the stainless steel substrate itself. FIG. 2 also sets forth the JCPDS (Joint Committee for Powder Diffraction Standards) reference for tin oxide ($SnO_2$). Each peak with an index number represents the rutile phase of $SnO_2$ with lattice parameters of a=b=4.745 A and c=3.190 A. The large peaks without an index number are attributed to the stainless steel substrate. As can be seen from the figure, the peak intensities generally increased with the temperature, which represents a change in growth from an amorphous phase (less than 400° C.) to a polycrystalline phase (400° C. to 700° C.). The characteristic peak broadening observed in the XRD patterns show that the thin films had a nanocrystalline structure. The change of the relative intensity ratio of peaks (110) and (101) between 500° C. to 600° C., indicates that the structure of the thin films changed with temperature. Thus, FIG. 2 shows that the crystalline structure of the thin films was changed by adjusting the deposition temperature.

Example 3

Effect of Deposition Temperature on Stoichiometry of Thin Film

Figure 3:
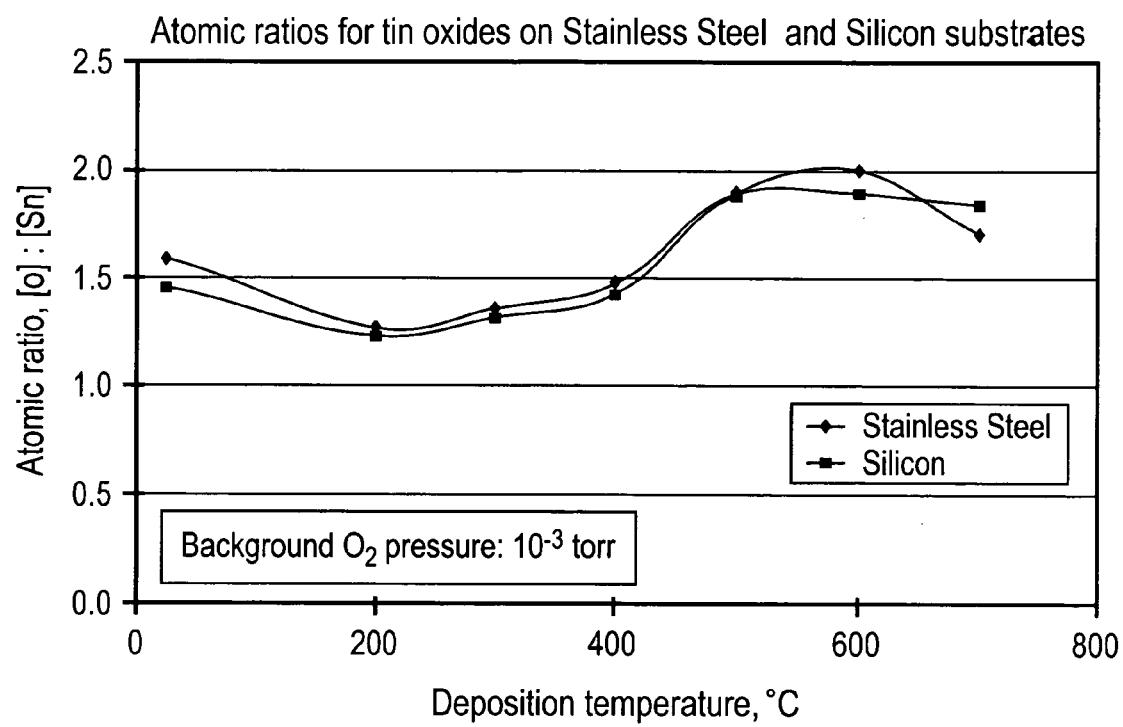
FIG. 3 is a graph showing the [O]:[Sn] atomic ratios for tin oxide thin films deposited on stainless steel and silicon substrates at various temperatures, according to an exemplary aspect.

FIG. 3 sets forth the oxygen to silicon atomic ratio ([O]:[Sn]) of thin films as a function of deposition temperature, for thin films grown on a stainless steel substrate and a silicon substrate. The atomic ratios were found ranging from 1.5 to 2.0 with the change of deposition temperature from about 25° C. to about 700° C. The results show that the thin films were amorphous with a mixture of tin monoxide (SnO) and tin dioxide ($SnO_2$) at relatively lower deposition temperatures. The proportion of SnO generally decreased at higher deposition temperatures, and the stoichiometry substantially became that of $SnO_2$ when the temperature reached about 600° C. The type of substrate (i.e., either stainless steel or silicon) did not appear to have a significant effect on the stoichiometry in light of the stoichiometric similarities of thin films grown on the two substrates. As seen from the above, the stoichiometry of the thin film can be controlled by varying the deposition temperature.

Example 4

Surface Morphology of Thin Film

Figure 4:
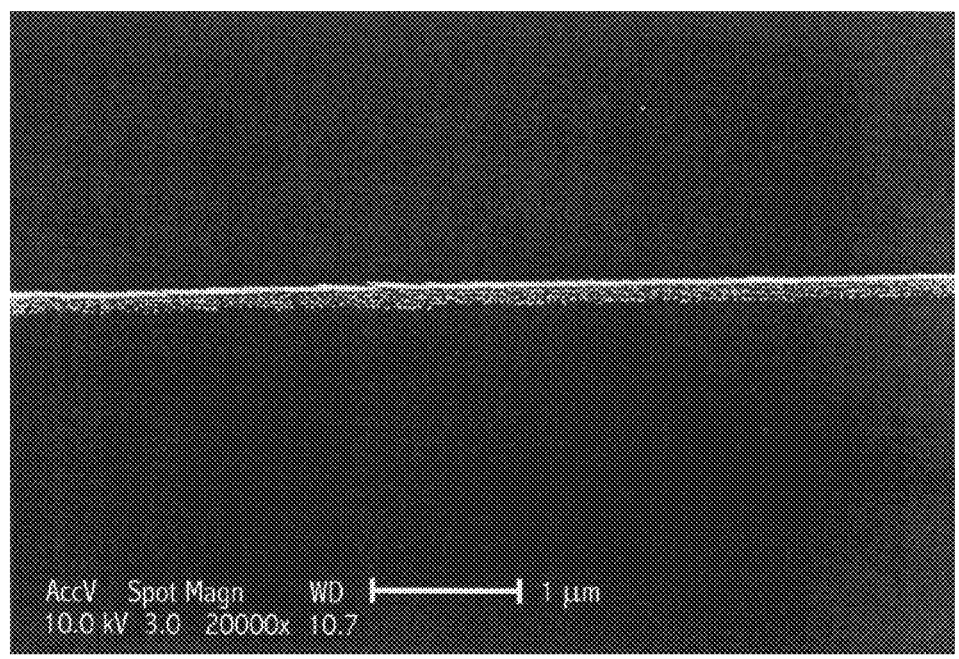
FIG. 4 is an SEM image of the cross section of a tin oxide thin film deposited on a silicon substrate, according to an exemplary aspect.
Figure 5:
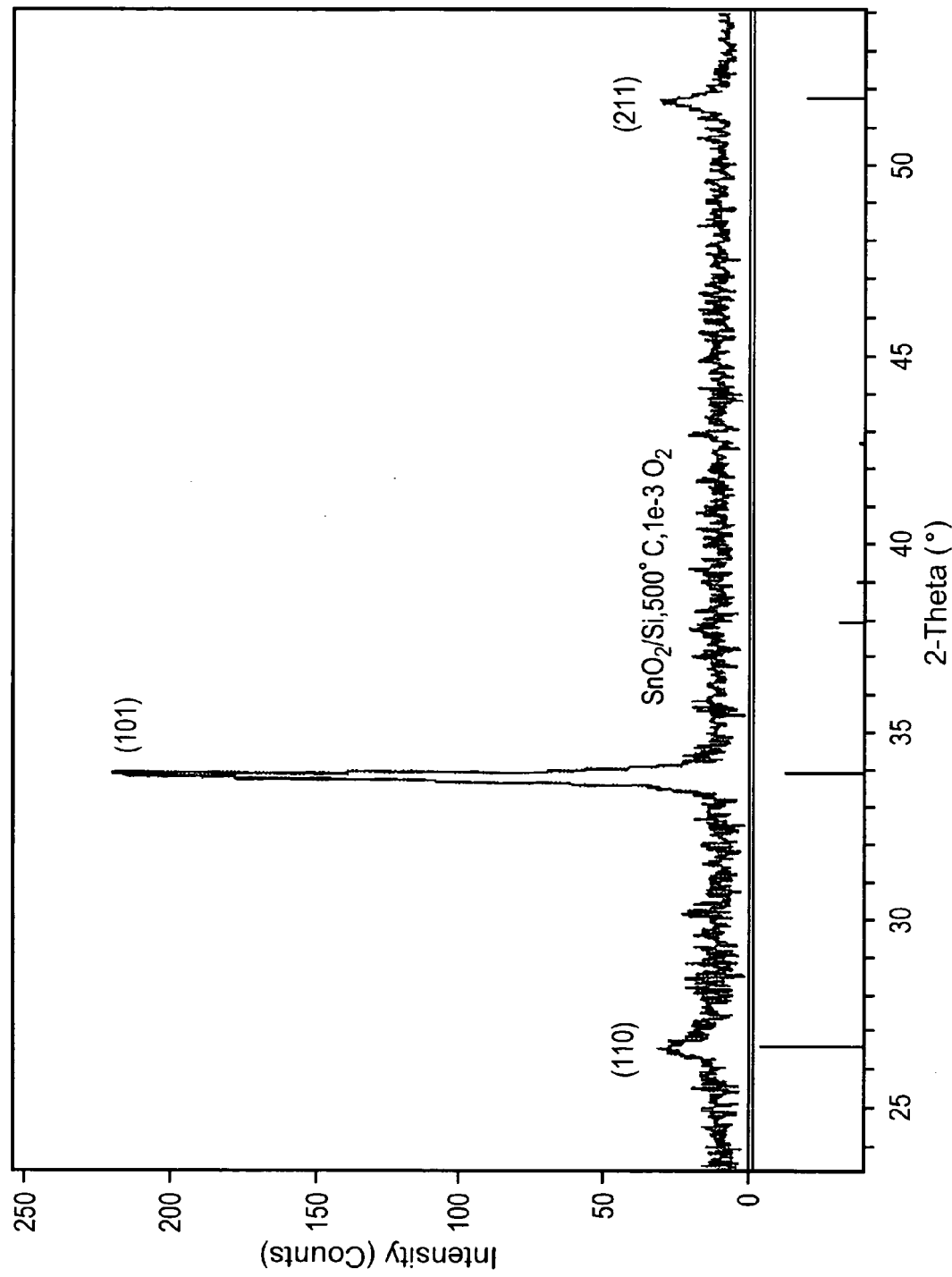
FIG. 5 is graph showing an X-ray diffraction pattern of an exemplary tin oxide thin film deposited on a silicon substrate, together with a JCPDS reference of tin oxide, according to an exemplary aspect.

Tin oxide thin films were deposited on a single crystal silicon substrate at a deposition temperature of 500° C. and oxygen pressure of $10^{-3}$ torr. The duration of the deposition process was 40 minutes. FIG. 4 is an SEM image of the cross section of the tin oxide thin film deposited on the silicon substrate. The SEM image shows that the thin film had a thickness of about 200 nm and a substantially smooth top surface. FIG. 5 shows the XRD pattern of the thin film together with the JCPDS reference for tin oxide, for phase identification.

Example 5

Electrochemical Performance of Thin Film

A tin oxide thin film was formed on a stainless steel substrate at a deposition temperature of 600° C. under 1 mTorr of oxygen pressure for 40 minutes. The weight of the tin oxide thin film was 0.146 mg as measured by ICP.

The electrochemical performance of the tin oxide thin film electrode was evaluated by using a charge-discharge test at ambient temperature. The test cell was composed of the tin oxide thin film cathode paired with a lithium metal foil as an anode in an electrolyte solution of 1.0 M $LiPF_6$ in a solvent formed from mixing ethylene carbonate and diethyl carbonate. A Celgard separator was used between the tin oxide thin film cathode and the lithium metal foil anode to prevent electric short circuit. The test cell was sealed in a plastic bag and the electrochemical performance of the cell was evaluated.

Figure 6:
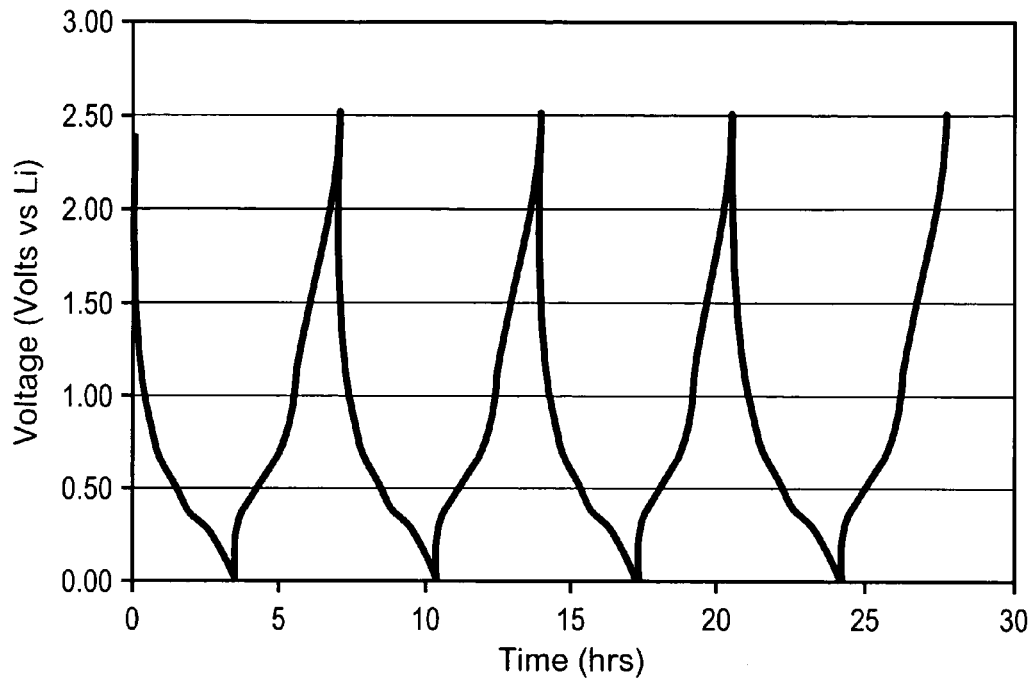
FIG. 6 is a graph showing the charge-discharge performance of an exemplary electronic device (time vs. voltage), measured between 0.02 V and 2.50 V and at a current of 50 µA, according to an exemplary aspect.
Figure 7:
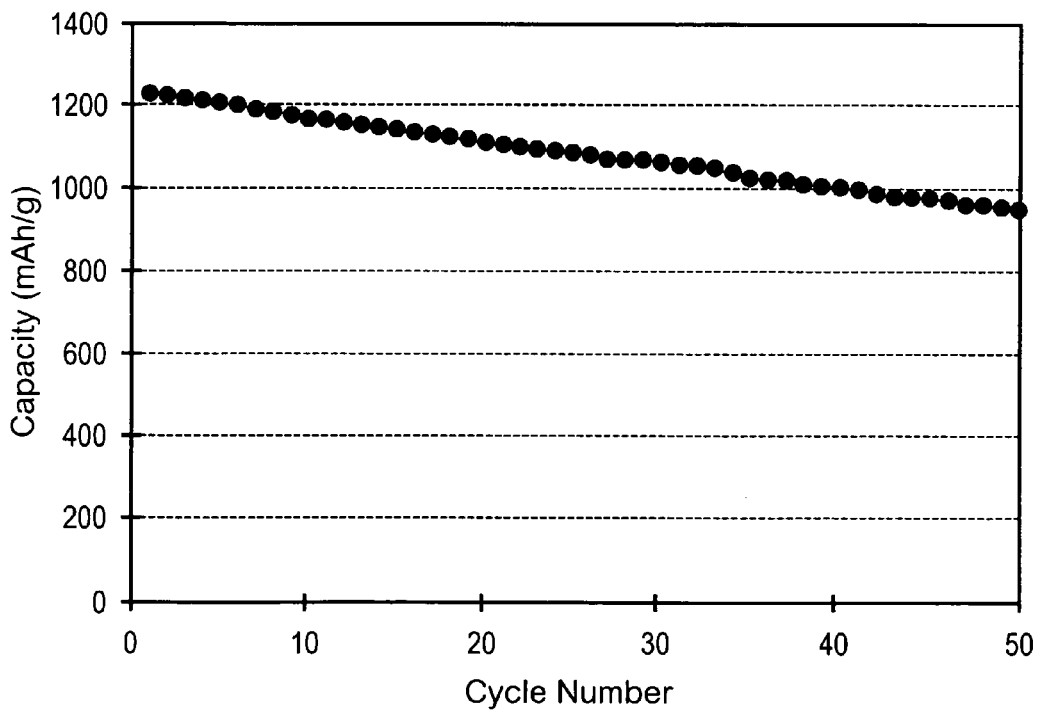
FIG. 7 is a graph showing the number of cycles versus the discharge capacity of a tin oxide thin film electrode deposited on a stainless steel substrate, according to an exemplary aspect.

FIG. 6 shows several charge-discharge cycles with a constant current of 50 µA and a voltage of between 0.02 V to 2.50 V vs. lithium metal. FIG. 7 shows the cycle performance of this thin film electrode. As can be seen from FIG. 7, the capacity density of this electrode was as high as 1200 mAh/g and the electrode maintained good cycle life.

The invention claimed is:

1. A method of fabricating a multi-layered thin film electrochemical device, comprising:
   providing a first target material in a chamber;

providing an electrically conductive substrate in the chamber;

emitting a first intermittent laser beam directed at the first target material to generate a first plasma, wherein each pulse of the first intermittent laser beam has a pulse duration of about 20 fs to about 1000 fs;

depositing the first plasma on or above the substrate to form a first thin film electrode;

providing a second target material in the chamber;

emitting a second intermittent laser beam directed at the second target material to generate a second plasma, wherein each pulse of the second intermittent laser beam has a pulse duration of about 20 fs to about 1000 fs; and depositing the second plasma on or above the first thin film to form a second thin film electrode;

wherein the first and second plasmas are substantially free of molten droplets and/or particulates having a size of about 1 μm or greater, wherein the first and second plasmas are deposited under conditions such that each of the first and second thin films has an average surface roughness of less than about 500 nm RMS, wherein the second thin film is a cathode thin film and the first thin film is an anode thin film, or the second thin film is an anode thin film and the first thin film is a cathode thin film; and wherein a solid electrolyte is formed between the first and second thin films, and wherein each of the first target material and second target material is a metal or metal oxide and the target material for forming the anode thin film is of a material which results in the anode thin film being capable of reversibly undergoing intercalation/de-intercalation and/or alloying/de-alloying with lithium ions.

2. The method of claim 1, wherein the solid electrolyte is formed from a conductive polymer.

3. The method of claim 2, wherein the deposition temperature during the step of depositing the second plasma is below about 300° C.

4. The method of claim 3, wherein the deposition temperature during the step of depositing the second plasma is about 25° C. to about 140° C.

5. The method of claim 1, wherein the substrate comprises a metal, silicon or a conductive polymer.

6. The method of claim 1, wherein the deposition temperature during the step of depositing the first plasma is about 20° C. to about 900° C.

7. The method of claim 6, wherein the deposition temperature during the step of depositing the first plasma is about 300° C. to about 500° C.

8. The method of claim 1, wherein the deposition temperature during the step of depositing the second plasma is about 20° C. to about 900° C.

9. The method of claim 8, wherein the deposition temperature during the step of depositing the second plasma is about 300° C. to about 500° C.

10. The method of claim 1, wherein the thickness of each of the first and second thin films is less than about 10 μm.

11. The method of claim 1, wherein each of the first and second thin films has an average surface roughness of less than about 50 nm RMS.

12. The method of claim 1, wherein the electrochemical device is selected from the group consisting of a solar cell, an electrochromic cell, a microfuel cell and a thin film battery.

13. The method of claim 1, further comprising a step of selecting a deposition temperature or temperatures at which the first and second plasmas are deposited to obtain a predetermined stoichiometry of the first and second thin films.

14. The method of claim 1, wherein the deposition temperature during the step of depositing the first and/or second plasmas is less than about 300° C.

15. The method of claim 14, wherein the deposition temperature during the step of depositing the first and/or second plasmas is about 25° C. to about 140° C.

16. The method of claim 1, wherein each of the first and second intermittent laser beams has a repetition rate of about 10 Hz to about 100 MHz.

17. The method of claim 1, wherein a buffer layer is positioned between the substrate and the first thin film.

18. The method of claim 1, wherein a current collector is positioned between the substrate and the first thin film.

19. The method of claim 1, wherein the substrate comprises a silicon or a conductive polymer.

20. The method of claim 1, wherein the substrate comprises a metal.

21. The method of claim 1, wherein the first or second target material comprises a metal oxide.

22. A method of fabricating a multi-layered thin film electrochemical device, comprising:

providing a first target material in a chamber;

providing an electrically conductive substrate in the chamber;

emitting a first intermittent laser beam directed at the first target material to generate a first plasma, wherein each pulse of the first intermittent laser beam has a pulse duration of about 20 fs to about 1000 fs;

depositing the first plasma on or above the substrate to form a first thin film electrode;

providing a second target material in the chamber;

emitting a second intermittent laser beam directed at the second target material to generate a second plasma, wherein each pulse of the second intermittent laser beam has a pulse duration of about 20 fs to about 1000 fs; and depositing the second plasma on or above the first thin film to form a second thin film electrode;

wherein the first and second plasmas are substantially free of molten droplets and/or particulates having a size of about 1 μm or greater, wherein the first and second plasmas are deposited under conditions such that each of the first and second thin films has an average surface roughness of less than about 500 nm RMS, wherein the second thin film is a cathode thin film and the first thin film is an anode thin film, or the second thin film is an anode thin film and the first thin film is a cathode thin film; and wherein a solid electrolyte is formed between the first and second thin films, wherein each of the first target material and second target material is a metal or metal oxide and the target material for forming the anode thin film is of a material which results in the anode thin film being capable of reversibly undergoing intercalation/de-intercalation and/or alloying/de-alloying with lithium ions, and wherein the first thin film electrode is deposited on the substrate, and provides for a reversible charge-discharge electrochemical reaction, and a decrease in capacity of no more than about 20% over 50 cycles of charge and discharge, and wherein the first thin film electrode is a tin oxide thin film, and the substrate is a stainless steel substrate.

23. The method of claim 22, wherein an initial capacity of the electrochemical device is up to about 1200 mAh/g.

24. A method of fabricating an electrochemical device having a thin film electrode portion, said method comprising:

directing laser pulses at a metal oxide target material disposed in a chamber to generate a first plasma, wherein each pulse has a pulse duration in the range from about 20 fs to about 1000 fs; and depositing a first plasma on or above a conductive substrate to form a thin film electrode;

wherein the plasma is substantially free of molten droplets and/or particulates having a size of about 1 μm or greater, wherein the plasma is deposited under conditions such that the thin film electrode has an average surface roughness of less than about 500 nm RMS, wherein the thin film electrode provides for a reversible charge-discharge electrochemical reaction, and a decrease in capacity of no more than about 20% over 50 cycles of charge and discharge, and wherein the target material for forming the electrode thin film is of a material which results in the electrode thin film being capable of reversibly undergoing intercalation/de-intercalation and/or alloying/de-alloying with lithium ions.

\* \* \* \* \*